(12) United States Patent
Ho et al.

(10) Patent No.: US 12,324,164 B2
(45) Date of Patent: Jun. 3, 2025

(54) ALIGNMENT MARK FOR MRAM DEVICE AND METHOD

(71) Applicant: Taiwan Semiconductor Manufacturing Company, Ltd., Hsinchu (TW)

(72) Inventors: Wei-De Ho, Hsinchu (TW); Lan-Hsin Chiang, Hsinchu (TW); Chien-Hua Huang, Toufen Township, Miaoli County (TW); Chung-Te Lin, Tainan (TW); Yung-Yu Wang, Hsinchu (TW); Sheng-Yuan Chang, Hsinchu (TW); Kai-Chieh Liang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 368 days.

(21) Appl. No.: 17/330,697

(22) Filed: May 26, 2021

(65) Prior Publication Data
US 2022/0384521 A1 Dec. 1, 2022

(51) Int. Cl.
*H10B 61/00* (2023.01)
*H10N 50/01* (2023.01)
*H10N 50/10* (2023.01)
*H10N 50/80* (2023.01)

(52) U.S. Cl.
CPC .............. *H10B 61/00* (2023.02); *H10N 50/01* (2023.02); *H10N 50/10* (2023.02); *H10N 50/80* (2023.02)

(58) Field of Classification Search
CPC ......... H10B 61/00; H10N 50/01; H10N 50/10
See application file for complete search history.

(56) References Cited

U.S. PATENT DOCUMENTS

| | | | |
|---|---|---|---|
| 2020/0051922 A1* | 2/2020 | Wang | H01L 23/544 |
| 2020/0185597 A1* | 6/2020 | Li | H10N 50/01 |
| 2022/0085284 A1* | 3/2022 | Liu | H10N 50/80 |

* cited by examiner

*Primary Examiner* — Jay C Kim
*Assistant Examiner* — Woo K Lee
(74) *Attorney, Agent, or Firm* — McClure, Qualey & Rodack, LLP

(57) ABSTRACT

Structures and formation methods of a semiconductor structure are provided. The semiconductor structure includes an insulating layer covering a device region and an alignment mark region of a semiconductor substrate. A conductive feature is formed in the insulating layer and corresponds to the device region. An alignment mark structure is formed in the first insulating layer and corresponds to the alignment mark region. The alignment mark structure includes a first conductive layer, a second conductive layer covering the first conductive layer, and a first magnetic tunnel junction (MTJ) stack layer covering the second conductive layer. The first conductive layer and the conductive feature are made of the same material.

20 Claims, 12 Drawing Sheets

ALIGNMENT MARK FOR MRAM DEVICE AND METHOD

BACKGROUND

Semiconductor memory devices are used in integrated circuits for electronic applications, including cell phones, personal computer device, and televisions, as exampled. One type of semiconductor memory is magnetoresistive random access memory (MRAM), which involves spin electronics that combines semiconductor technology and magnetic materials and devices. The spins of electrons, through their magnetic moments, are used to indicate bit values.

In an MRAM device, data is stored by magnetic storage elements. The magnetic storage elements typically include a magnetic tunnel junction (MTJ) stack, which includes two magnetic layers separated by a thin insulating layer. In such an MTJ stack, a first magnetic layer is referred to as a fixed/pinned layer, while a second magnetic layer is referred to as a free layer.

However, with the development of new MRAM devices, fabrication processes continue to become more difficult to perform and new challenges are being discovered. For example, the non-transparent MTJ stack makes the lithography alignment more challenging.

BRIEF DESCRIPTION OF THE DRAWINGS

Aspects of the present disclosure are best understood from the following detailed description when read with the accompanying FIGS. It should be noted that, in accordance with the standard practice in the industry, various features are not drawn to scale. In fact, the dimensions of the various features may be arbitrarily increased or reduced for clarity of discussion.

FIGS. 2A to 2K are cross-sectional views of intermediate stages of in the manufacturing of an alignment mark structure for an MRAM cell structure, in accordance with some embodiments, in which FIG. 2A illustrates a subsequent processing stage for the structure shown in FIG. 1.

FIGS. 3A to 3L are cross-sectional views of intermediate stages of in the manufacturing of an alignment mark structure for an MRAM cell structure, in accordance with some embodiments, in which FIG. 3A illustrates a subsequent processing stage for the structure shown in FIG. 1.

DETAILED DESCRIPTION

Figure 1:
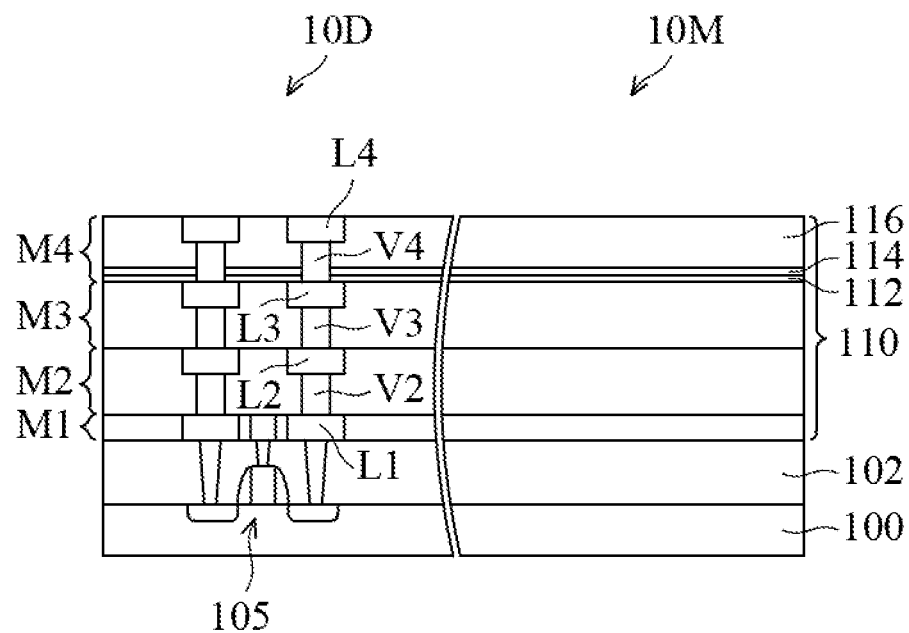
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. FIGS. 1 and 2A to 2K are cross-sectional views of various stages of a method for forming a semiconductor structure, in accordance with some embodiments. Additional operations can be provided before, during, and/or after the stages described in FIGS. 1 and 2A to 2K. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a cross-sectional view of a semiconductor structure, in accordance with some embodiments. The semiconductor structure includes a device region 10D and an alignment mark region 10M. In some embodiments, memory cell structures (e.g., MRAM cell structures) are subsequently formed in the device region 10D and alignment mark structures are subsequently formed in the alignment mark region 10M. More specifically, the device region 10D may include a cell region and a logic region, in which an MRAM array (not shown) including the MRAM cell structures can be formed in the cell region, and row and column decoders (not shown) can be formed in the logic region. Moreover, the alignment mark region 10M including one or more alignment mark structures may be located at a scribe region (not shown) that surrounding the device region 10D.

In some embodiments, a substrate 100, such as a device wafer is provided, as shown in FIG. 1A. The substrate 100 may be made of silicon or other semiconductor materials. The substrate 100 may be doped or undoped, or an active layer of a semiconductor-on-insulator (SOI) substrate. Alternatively or additionally, the substrate 100 may include other elementary semiconductor materials such as germanium. In some embodiments, the substrate 100 is made of a compound semiconductor such as silicon carbide, gallium arsenic, indium arsenide, or indium phosphide. In some embodiments, the substrate 100 is made of an alloy semiconductor such as silicon germanium, silicon germanium carbide, gallium arsenic phosphide, or gallium indium phosphide. In some embodiments, the substrate 100 includes an epitaxial layer. For example, the substrate 100 has an epitaxial layer overlying a bulk semiconductor. Other substrates, such as multilayered or gradient substrates, may also be used.

The substrate 100 (which may be referred to as a semiconductor substrate) has the alignment mark region 10M and the device region 10D, in accordance with some embodiments. Herein, FIG. 1 is simplified, and some devices/features (discussed below) are omitted for clarity of illustration. Devices 105 are formed at the active surface of the substrate 100 and corresponding to the device region 10D. The devices 105 may be active devices (e.g., transistors, or the like) or passive devices (e.g., capacitors, resistors, or the like). For example, the devices 105 may be access transistors formed by any suitable formation method. As shown in FIG. 1, only a device 105 is depicted the device 105, which is interconnected to form the memory devices in the device region 10D.

In some embodiments, one or more inter-layer dielectric (ILD) layer(s) 102 are formed over the substrate 100 to cover the device region 10D and the alignment mark region 10M of the substrate 100. Electrically conductive features (e.g., contact plugs), are formed and electrically connected to the device 105. The ILD layer(s) 102 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like. The ILD layer(s) 102 may be formed by any acceptable deposition process, such as spin coating, physical vapor deposition (PVD), chemical vapor deposition (CVD), the like, or a combination thereof. The electrically conductive features in the ILD layer(s) 102 may be formed through any suitable process, such as deposition.

Afterwards, an interconnect structure 110 is formed over the ILD layer(s) 102 and corresponding to the device region 10D of the substrate 100. The interconnect structure 110 is electrically connected to the device 105 to form an integrated circuit in the device region 10D. The interconnect structure 110 may include multiple metallization layers M1 to M4. Although four metallization layers are illustrated, it should be appreciated that more or less metallization layers may be included. Each of the metallization layers M1 to M4 includes metallization patterns in one or more inter-metal dielectric (IMD) layers. The metallization patterns are electrically connected to the device 105, and include, respectively, metal lines L1 to L4 and metal vias V2 to V4 formed in the one or more inter-metal dielectric (IMD) layers covering the ILD layer(s) 102 and corresponding to the device region 10D and the alignment mark region of the substrate 100. The interconnect structure 110 may formed by a damascene process, such as a single damascene process, a dual damascene process, or the like. FIG. 1 is also labeled with some reference numerals that will be described further below.

The memory cells/devices (not shown) are formed over the interconnect structure 110 and corresponding to the device region 10D of the substrate 100. The memory cells, such as MRAM cells, can be formed in a metallization layer above the metallization layers M1 to M4. Each MRAM cell structure may include a conductive via, a bottom electrode on the conductive via, a magnetic tunnel junction (MTJ) stack layer on the bottom electrode, and a top electrode on the MTJ stack layer. The resistance of an MTJ stack layer is programmable, and can be changed between a high resistance, which can signify a value such as a logic "1," and a low resistance, which can signify a value such as a logic "0." As such, a value can be written to a MRAM cell by programming the resistance of the MTJ stack layer with its corresponding access transistor, and the value can be read from the MRAM cell by measuring the resistance of the MTJ stack layer with the access transistor.

The MRAM cell structures may be electrically connected to the devices 105 by the underlying metallization pattern, such as to the metal lines L4 in the illustrated example. The top electrode of each MRAM cell structure is physically and electrically connected to an overlying metallization pattern (not shown). The memory cell structures are arranged in a MRAM array. The metallization patterns include access lines (e.g., word lines and bit lines) for the MRAM array. For example, the underlying metallization patterns can include word lines and the overlying metallization patterns can include bit lines.

Figure 2A:
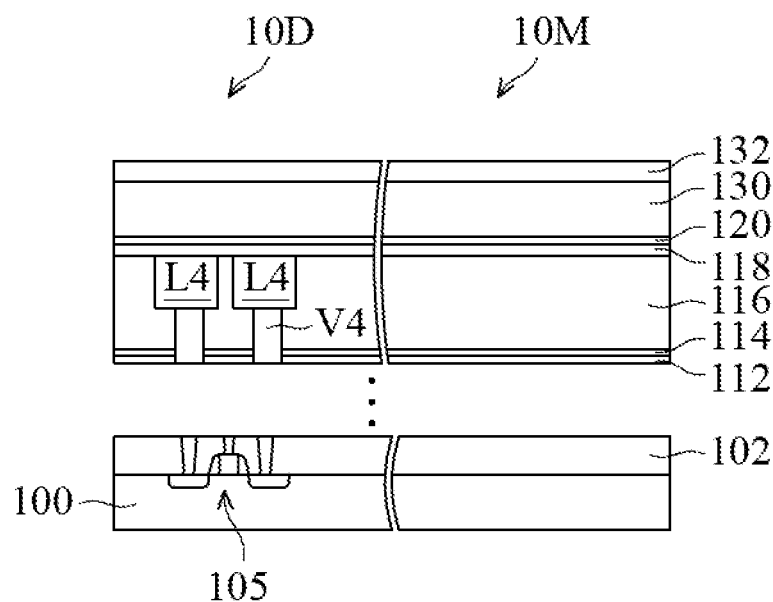

FIGS. 2A-2K are cross-sectional views of intermediate stages of in the manufacturing of an alignment mark structure for an MRAM cell structure, in accordance with some embodiments, in which FIG. 2A illustrates a further processing stage for the structure shown in FIG. 1. In FIG. 2A, a metallization layer (e.g., metallization layer M4 of the interconnect structure 110) as shown in FIG. 1 is provided, in accordance with some embodiments. The metallization layer includes a composite layer including a barrier layer 112 and an overlying adhesive layer 114 (which are sometimes referred to as etch stop layers), an insulating layer 116 (which is also referred to as IMD layer) on the composite layer, and conductive features including the metal lines L4 and the corresponding metal vias V4, see FIG. 1) formed in the insulating layer 116 and the underlying composite layer including the layers 112 and 114.

Such a metallization layer is formed over the ILD layer(s) 102. More specifically, the barrier layer 112 of the metallization layer may be made of TaN and the adhesive layer 114 of the metallization layer may be made of TiN. The composite layer may be formed by any suitable deposition process, such as spin coating, PVD, CVD, the like, or a combination thereof.

The insulating layer 116 of the metallization layer may be formed of any suitable dielectric material, for example, silicon nitride, silicon oxide, phosphosilicate glass (PSG), borosilicate glass (BSG), boron-doped phosphosilicate glass (BPSG), undoped silicate glass (USG), fluorosilicate glass (FSG) or the like. The insulating layer 116 may be formed by any suitable deposition process, such as spin coating, PVD, CVD, the like, or a combination thereof. The insulating layer 116 may be a layer formed of a low-k dielectric material (which has a k-value less than about 3.0) or an extra-low-k (ELK) dielectric material (which has a k-value of less than 2.5).

Conductive features (including the metal lines L4 and the corresponding metal vias V4) of metallization layer are electrically connected to the device 105. Those conductive features may include diffusion barrier layers and conductive material over the conductive barrier layers. The diffusion barrier layers may be formed of TaN, Ta, TiN, Ti, CoW, or the like, and the conductive material may include copper, aluminum, tungsten, silver, and combinations thereof, or the like, and may be formed over the diffusion barrier layers.

Afterwards, one or more etch stop layer(s) are formed over the conductive features and the insulating layer 116. In some embodiments, etch stop layers 118 and 120 are formed, as shown in FIG. 2A. The etch stop layers 118 and 120 may be respectively made of a first dielectric material and a second dielectric material different than the first dielectric material. The first and second dielectric materials may include, for example, silicon oxide, silicon nitride, silicon oxynitride, silicon carbide, silicon carbon nitride, the like, or a combination thereof. The etch stop layers 118 and 120 may be formed by CVD, PVD, ALD, spin coating, the like, or a combination thereof.

Afterwards, an IMD layer is formed over the etch stop layers 118 and 120 to cover the device region 10D and the alignment mark region 10M of the substrate 100. In some embodiments, the IMD layer includes two insulating layers 130 and 132. The insulating layer 130 is made of a first dielectric material and the overlying insulating layer 132 is made of a second dielectric material different than the first dielectric material. For example, the insulating layer 130 may be made of aluminum oxide ($AlO_x$) and the overlying insulating layer 132 may be made of tetraethyl orthosilicate (TEOS) oxide) different than the first dielectric material. In some other embodiments, the insulating layers 130 and 132 may be made of phosphosilicate glass (PSG), borosilicate glass (BSG), boron-doped phosphosilicate glass (BPSG), undoped silicate glass (USG), fluorosilicate glass (FSG), flowable oxide, a porous oxide, or the like, or combinations thereof. The insulating layers 130 and 132 may also be formed of a low-k dielectric material. The insulating layers 130 and 132 may be formed by spin-on coating, flowable CVD (FCVD), plasma enhanced chemical vapor deposition (PECVD), low pressure chemical vapor deposition (LPCVD), or the like.

Figure 2B:
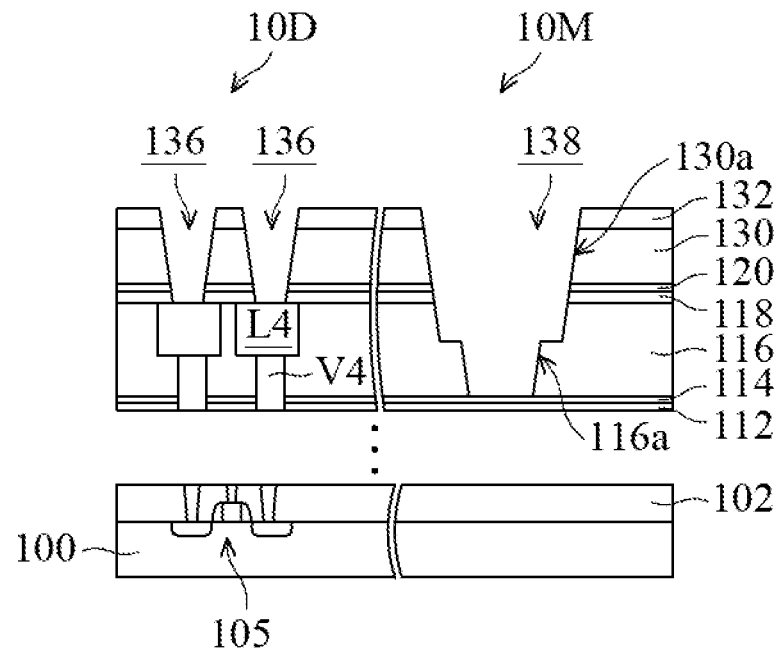

After the insulating layers 130 and 132 are formed, the insulating layers 130 and 132 are patterned to form openings therein, as shown in FIG. 2B in accordance with some embodiments. More specifically, the insulating layers 130 and 132 are patterned by lithography and etching processes. After the lithography process is performed, a photoresist layer (not shown) with via patterns (dense patterns) and at least one trench pattern (isolated pattern) is formed over the insulating layer 132. Afterwards, one or more etching processes (such as a wet etching process, a dry etching process, or a combination thereof) are performed using the photoresist layer as an etch mask. As a result, via openings 136 are formed in the insulating layers 130 and 132 corresponding to the device region 10D and at least one trench opening 138 is formed in the insulating layers 130 and 132 corresponding to the alignment mark region 10M. In some embodiments, each of the via openings 136 are aligned to and expose the top surface of the corresponding metal line L4. Moreover, the formed trench opening 138 extends into a portion of the insulating layer 116 due to the loading effect in the etching processes, so that the trench opening 138 has a deeper depth than the via openings 136. Afterwards, a dry etching process is performed on the insulating layer 116 on the bottom of the trench opening 138, so that the trench opening 138 is further recessed to pass through the insulating layer 116 and expose the underlying adhesive layer 114. As a result, the trench opening 138 forms a topography region for the subsequent fabrication of an alignment mark structure for lithography. In some embodiments, the trench opening 138 includes a lower portion with tapered sidewalls 116a and a top width, and an upper portion with tapered sidewalls 130a and a top width. The top width of the upper portion is greater than the top width of the lower portion, in which the tapered sidewalls 130a are not aligned to the tapered sidewalls 116a, and results in the trench opening 138 having sidewalls with a stepped and tapered profile, as shown in FIG. 2B.

Figure 2C:
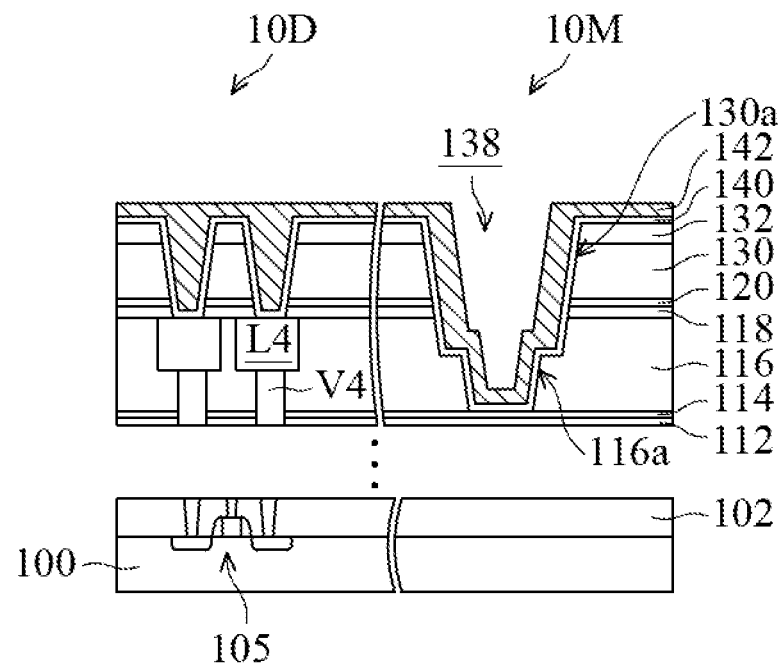
Figure 2D:
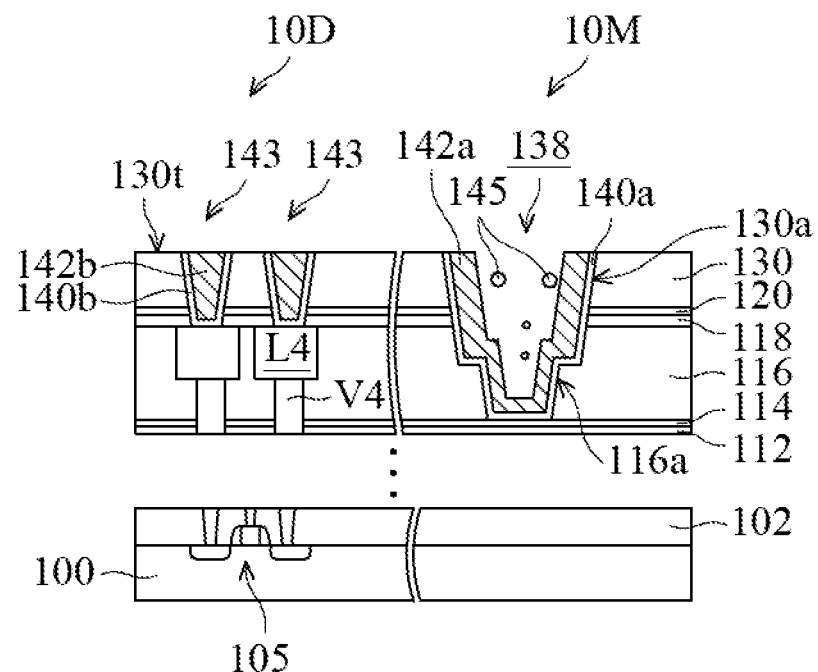

After the via openings 136 and the trench opening 138 are formed, conductive features 143 are formed, as shown in FIGS. 2C to 2D in accordance with some embodiments. In some embodiments, a conductive layer 142 is formed over the insulating layer 132 corresponding to the device region 10D and the alignment mark region 10M and fills the via openings 136 (see FIG. 2B) and the trench opening 138. As shown in FIG. 2C, the via openings 136 are fully filled with the conductive layer 142. Moreover, the conductive layer 142 conformally covers the stepped and tapered sidewalls (including the sidewalls 116a and 130a) and the bottom surface of the trench opening 138. The conductive layer 142 may be made of a metal-containing material such as copper, aluminum, tungsten, cobalt, alloys thereof, the like, or combinations thereof, and may be formed by, for example, CVD, PVD, sputtering, electroplating, electroless plating, or other suitable method.

In some embodiments, prior to the formation of the conductive layer 142, a barrier layer 140 is formed conformally over the insulating layer 132 corresponding to the device region 10D and the alignment mark region 10M and fills the via openings 136 and the trench opening 138. The barrier layer 140 may include an electrically conductive material such as titanium nitride, although other materials, such as tantalum nitride, titanium, tantalum, or the like, may alternatively be utilized. The barrier layer 140 may be formed using a CVD process (such as PECVD) or other alternative processes (such as sputtering, or metal organic chemical vapor deposition (MOCVD)).

After the formation of the conductive layer 142, a planarization process is performed on the structure shown in FIG. 2C, as shown in FIG. 2D in accordance with some embodiments. The planarization process (such as a chemical mechanical polish (CMP) or a mechanical grinding process) is performed for the removal of the excess portions of the conductive layer 142 and the barrier layer 140 (excess portions of which are over the top surface of the insulating layer 130), and the insulating layer 132. The remaining barrier layer 140b and the remaining conductive layer 142b in each via opening 136 thus form the conductive feature 143 (which is also referred to as conductive via) that is electrically connected to the underlying conductive feature (including the metal line L4 and the corresponding metal via V4).

Moreover, the remaining barrier layer 140a and the remaining conductive layer 142a in the trench opening 138 thus form a portion of the subsequently formed alignment mark structure. However, undesired slurry's abrasive 145 (such as $AlO_x$ or $SiO_x$ particles) from the CMP process may be remained in the topography region formed by the trench opening 138. In some embodiments, a wet clean process using a solvent (e.g., ammonium hydroxide peroxide mixture (APM)) is performed after the planarization process, so as to remove the undesired slurry's abrasive 145 from the trench opening 138.

Figure 2E:
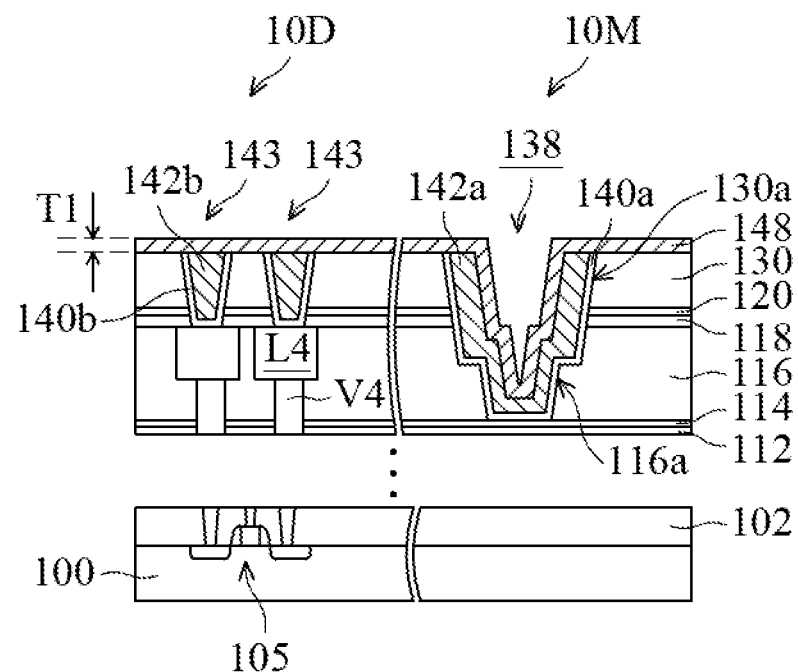
Figure 2F:
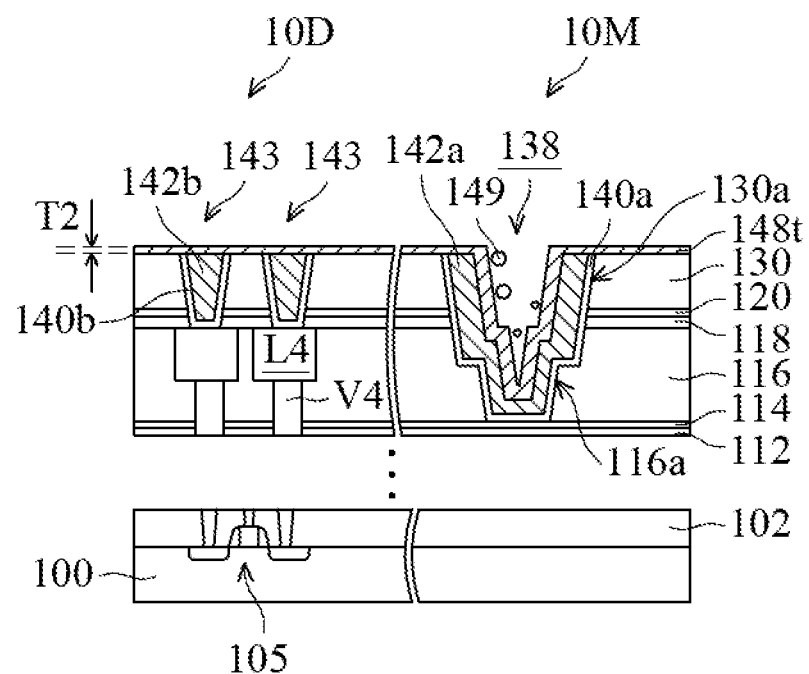

After the conductive vias 143 are formed, a bottom electrode layer is formed conformally over the structure shown in FIG. 2D, as shown in FIGS. 2E to 2F. More specifically, as shown in FIG. 2E, a conductive layer 148 is formed to cover the insulating layer 130 corresponding to the device region 10D and the alignment mark region 10M, the remaining conductive vias 143, and the remaining barrier layer 140a and the conductive layer 142a in the trench opening 138. A portion of the conductive layer 148 corresponding to the device region 10D serves as a bottom electrode layer for a subsequently formed MRAM cell structure. A portion of the conductive layer 148 filled into the trench opening 138 forms a portion of the subsequently formed alignment mark structure. The conductive layer 148 may be made of a conductive material such as Cu, Al, Ti, Ta, W, Pt, Ni, Cr, Ru, TiN, TaN, a combination thereof, or the like. For example, the conductive layer 148 may be made of TiN. The conductive layer 148 may be formed by CVD, PVD, electro-chemical plating (ECP), electroless plating, or the like. The conductive layer 148 may be formed to a thickness T1 in a range from about 100 Å to about 200 Å (e.g., about 160 Å).

Afterwards, the conductive layer 148 shown in FIG. 2E is thinned, as shown in FIG. 2F. In some embodiments, a planarization process, such as a CMP process, is performed on the conductive layer 148, so that a thinned conductive layer 148t having a first portion with a thickness T2 above the trench opening 138 and a second portion with the thickness T1 (see FIG. 2E) in the trench opening 38 is resulted. For example, the thickness T2 may be in a range from about 50 Å to about 100 Å (e.g., about 80 Å).

As shown in FIG. 2F, the second portion of the thinned conductive layer 148t in the trench opening 38 has sidewall surfaces and a bottom surface surrounded by the conductive layer 142 in the trench opening 38. Moreover, the first portion of the thinned conductive layer 148t covers the top of the conductive layer 142 formed in the trench opening 38. Since the conductive layer 148 has a roughness surface after the TiN deposition, such a planarization process can effectively reduce the roughness of the conductive layer 148. This is helpful for the subsequent deposition of layers on the thinned conductive layer 148t. Similarly, undesired slurry's abrasive 149 (such as $AlO_x$ or $SiO_x$ particles) from the CMP process may also be remained in the topography region formed by the trench opening 138. In some embodiments, a wet clean process using a solvent (e.g., APM) is performed after the planarization process, so as to remove the undesired slurry's abrasive 149 from the trench opening 138.

Figure 2G:
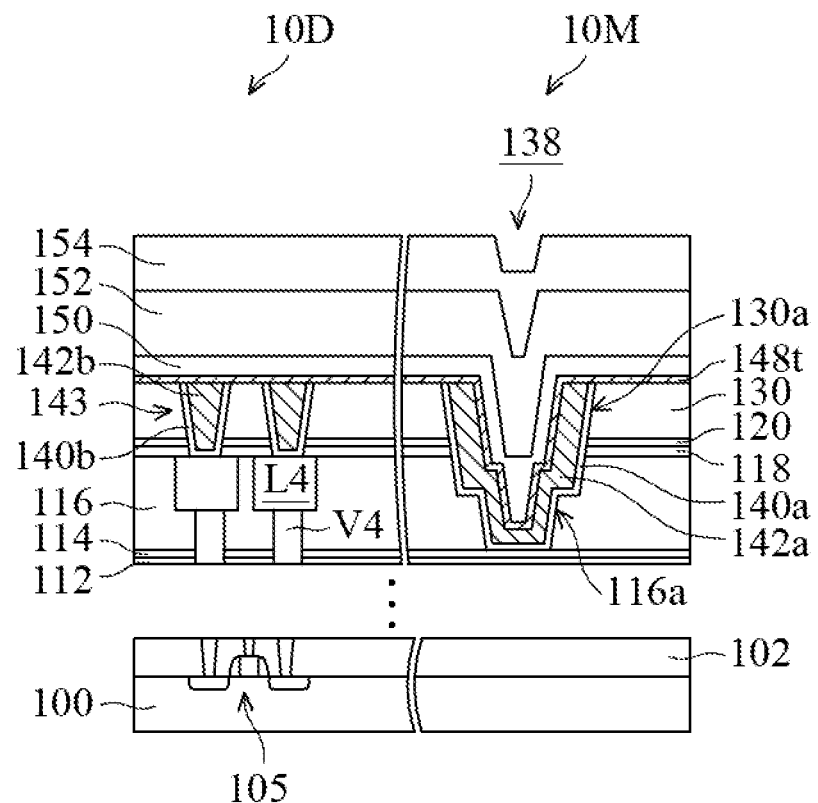

After the removal of the undesired slurry's abrasive 149, a MTJ stack layer 150, a conductive layer 150, and a masking layer 154 are successively formed over the thinned conductive layer 148t to cover the device region 10D and the alignment mark region 10M, as shown in FIG. 2G in accordance with some embodiments. More specifically, the MTJ stack layer 150 is formed over the thinned conductive layer 148t above the insulating layer 130 and fills the trench opening 138. As shown in FIG. 2G, the MTJ stack layer 150 has a first portion above the trench opening 138 and a second portion in the trench opening 38. The second portion of the MTJ stack layer 150 in the trench opening 38 has sidewall surfaces and a bottom surface surrounded by the conductive layer 148t formed in the trench opening 38. Moreover, the first portion of the MTJ stack layer 150 covers the top of the conductive layer 142 formed in the trench opening 38 and forms an alignment mark with the underlying layers 148t, 142a, and 140a.

Typically, the MTJ stack layer 150 is a multilayer that includes an anti-ferromagnetic layer, a pinned layer over the anti-ferromagnetic layer, a tunnel barrier layer over the pinned layer, and a free layer over the tunnel barrier layer. Herein, in order to simplify the diagram, only a single layer is depicted. Each layer of the MTJ stack layer 150 may be deposited using one or more deposition methods such as, CVD, PVD, ALD, a combination thereof, or the like. The anti-ferromagnetic layer may be made of a metal alloy including manganese (Mn) and one or more other metal(s) such as platinum (Pt), iridium (Ir), rhodium (Rh), nickel (Ni), palladium (Pd), iron (Fe), or the like. The pinned layer may be made of a ferromagnetic material such as cobalt iron (CoFe), cobalt iron boron (CoFeB), a combination thereof, or the like. The tunnel barrier layer may be formed of a dielectric material, such as MgO, AlO, AlN, the like, or a combination thereof. The free layer may be made of a ferromagnetic material such as CoFe, NiFe, CoFeB, CoFeBW, the like, or a combination thereof.

After the MTJ stack layer 150 is formed, a conductive layer 152 and an overlying masking layer 154 are successively formed over the MTJ stack layer 150 corresponding to the device region 10D and the alignment mark region 10M. More specifically, the conductive layer 152 is formed conformally to cover the MTJ stack layer 150 corresponding to the conductive vias 143 and the trench opening 138. A portion of the conductive layer 152 corresponding to the device region 10D serves as a top electrode layer for a subsequently formed MRAM cell structure. A portion of the conductive layer 152 extending into the trench opening 138 forms a portion of the subsequently formed alignment mark structure. The second portion of the conductive layer 152 in the trench opening 38 has sidewall surfaces and a bottom surface surrounded by the MTJ stack layer 150 formed in the trench opening 38.

The conductive layer 152 may be made of a conductive material that is the same as or similar to that of the conductive layer 148. For example, the conductive layer 152 may be made of TiN. Similarly, the conductive layer 152 may be formed by CVD, PVD, ECP, electroless plating, or the like. In some embodiments, the thickness of the top electrode layer (i.e., the conductive layer 152) is greater than the bottom electrode layer (i.e., the thinned conductive layer 148t).

The masking layer 154 formed over the conductive layer 152 may be made of an oxide such as TEOS oxide, titanium oxide, the like, or a combination thereof. The masking layer 154 may be formed by spin-on coating, FCVD, PECVD, LPCVD, or the like. In some embodiments, the masking layer 154 and the underlying conductive layer 152 are used as a hard mask in the subsequent patterning of the MTJ stack layer 150.

Figure 2H:
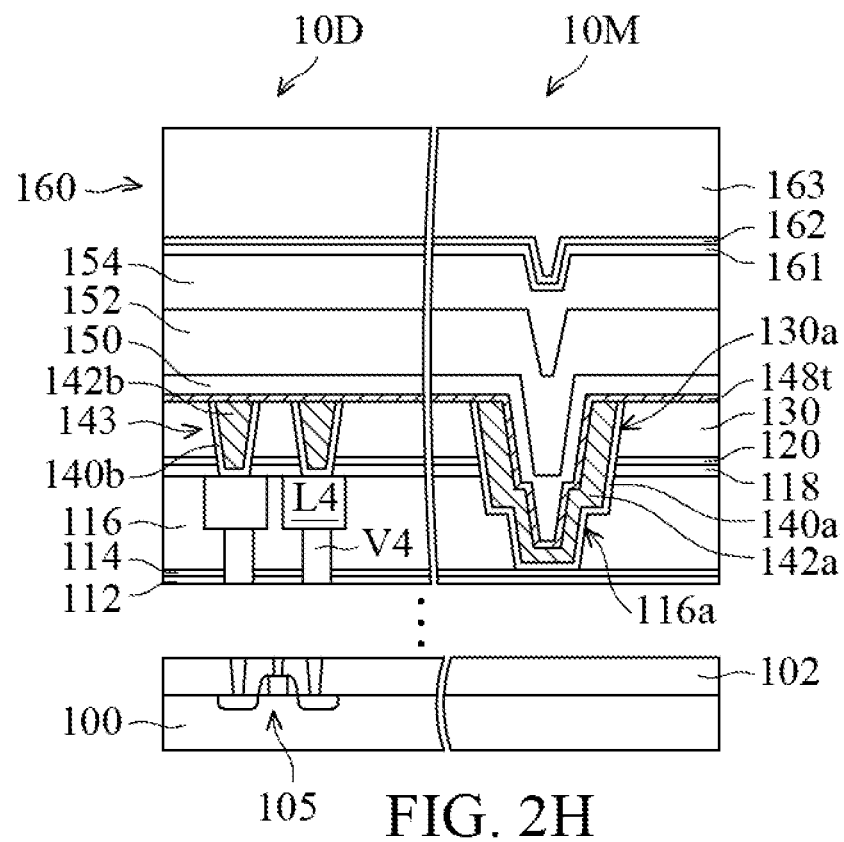

Afterwards, a tri-layer mask structure 160 is formed over the hard mask including the masking layer 152 and the conductive layer 152, as shown in FIG. 2H in accordance with some embodiments. More specifically, the tri-layer mask structure 160 and the underlying hard mask are used to simultaneously pattern the various layers and form MRAM cell structures. In some embodiments, the tri-layer mask structure 160 includes a bottom anti-reflective coating (BARC) layer 161, an intermediate layer 162 over the BARC layer 161, and a top photoresist layer 163 over the intermediate layer 162.

Figure 2I:
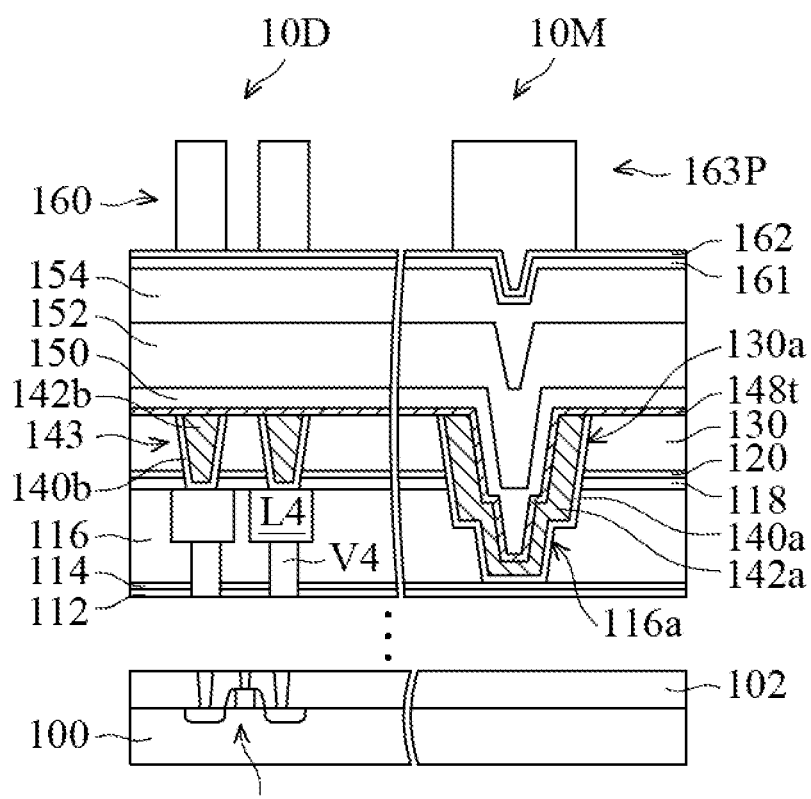

After the tri-layer mask structure 160 is formed, MRAM cell patterns and at least one alignment mark pattern are formed in the top photoresist layer 163 to define MRAM cell structures, as shown in FIG. 2I in accordance with some embodiments. More specifically, a lithography process is performed using the alignment mark structure (which at least includes the MTJ stack layer 150, the conductive layers 148t and 142a, and the barrier layer 140a formed in the trench opening 138 (see FIG. 2G)) in the alignment mark region 10M. As a result, a patterned top photoresist layer 163P with the MRAM cell patterns corresponding to the device region 10D and the alignment mark pattern corresponding to the alignment mark region 10M is formed to expose portions of the intermediate layer 162, as shown in FIG. 2I.

Figure 2J:
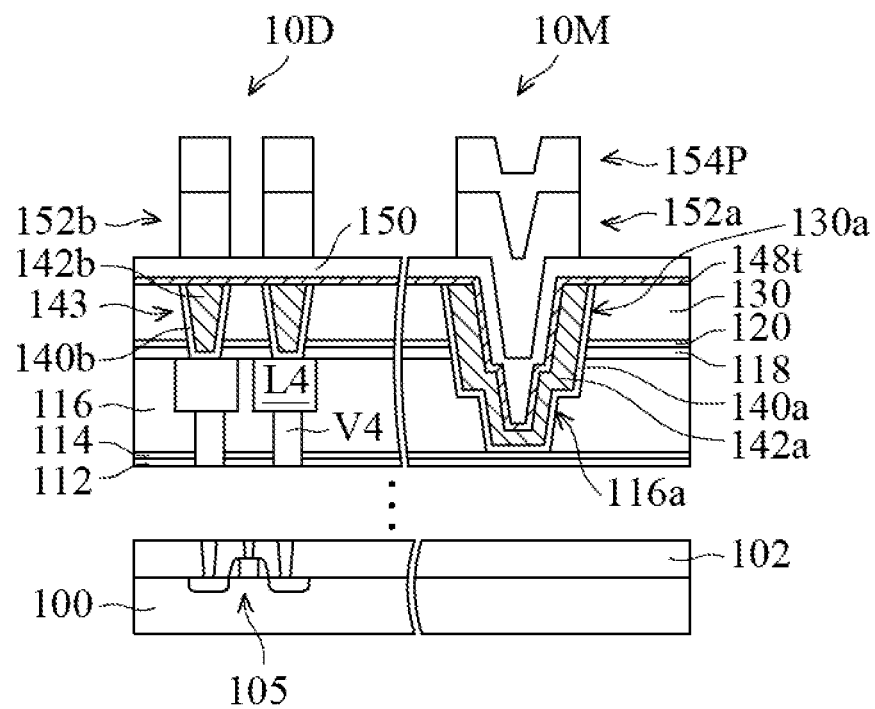

After the patterned top photoresist layer 163P with the MRAM cell patterns and the alignment mark pattern is formed, these patterns are transferred into the masking layer 154 and the conductive layer 152 thereunder by an etching process, as shown in FIG. 2J in accordance with some embodiments. More specifically, the exposed portions of the intermediate layer 162 and the underlying layers (including the BARC layer 161 and the masking layer 154) are successively etched using the patterned top photoresist layer 163P as an etch mask. The etching process may include a plasma etching method, such as ion beam etching (IBE). The etching process may be implemented using glow discharge plasma (GDP), capacitive coupled plasma (CCP), inductively coupled plasma (ICP), or the like. The patterned top photoresist layer 163P, the intermediate layer 162 and the BARC layer 161 may be consumed in the etching process, or may be removed after the etching process.

During the etching process, the patterned masking layer 154P is then used as an etch mask to pattern the conductive layer 152 thereunder. As a result, the patterned conductive layer 152 with the MRAM cell patterns corresponding to the device region 10D and the alignment mark pattern corresponding to the alignment mark region 10M is formed to expose portions of the MTJ stack layer 150, as shown in FIG. 2J. In some embodiments, the patterned conductive layer 152 corresponding to the device region 10D forms top electrode layers 152b for the subsequently formed MRAM cell structures. The patterned conductive layer 152 corresponding to the alignment mark region 10M forms an addition alignment mark portion 152a of the alignment mark structure.

Figure 2K:
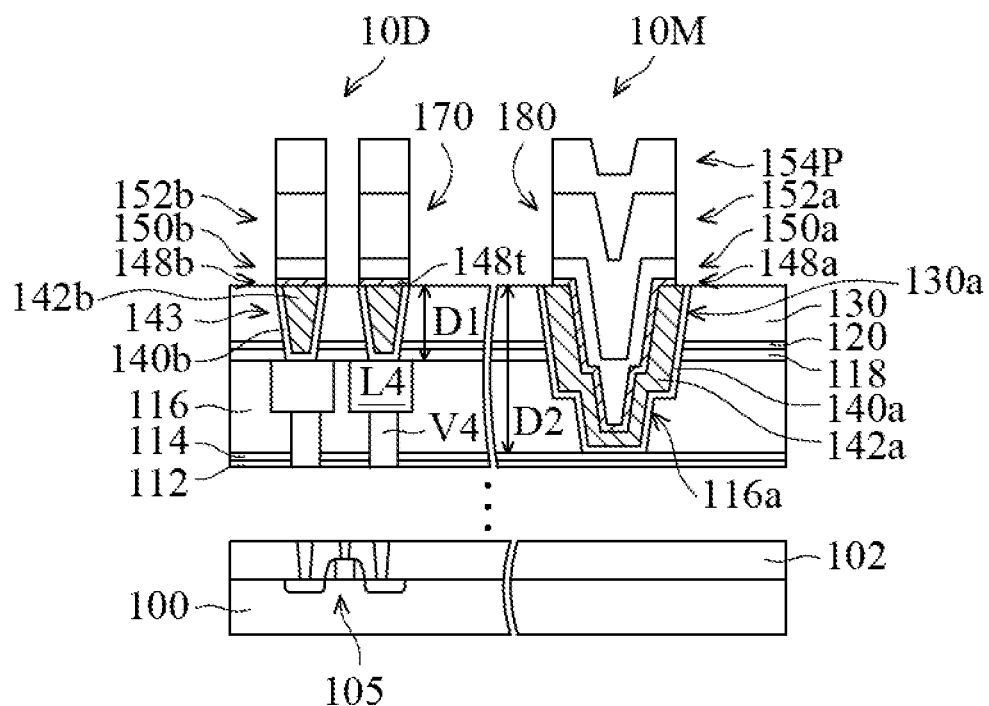

Afterwards, the patterned masking layer 154P and the patterned conductive layer 152 (including the addition alignment mark portion 152a and the top electrode layers 152b) are used an etch mask to etch and pattern the exposed portions of the MTJ stack layer 150 and the thinned conductive layer 148t thereunder, as shown in FIG. 2K in accordance with some embodiments. The patterning may include one or more etching processes, which may include a plasma etching method, such as IBE using GDP, CCP, ICP, or the like.

The etching process forms bottom electrode layers 148b and MTJ stack layers 150b, which together form MRAM cell structures 170 with the top electrode layers 152b. Each MRAM cell structure 170 corresponding to the device region 10D includes one bottom electrode layer 148b electrically connected to a corresponding conductive via 143, one MTJ stack layer 150b formed over the bottom electrode layer 148b, and one top electrode layer 152b formed over the MTJ stack layer 150b. In some embodiments, additional spacers (not shown) are also formed around the memory cell structures (e.g., MRAM cell structures 170) to surround and protect the components of the memory cell structures.

The etching process also forms a conductive pattern layer 148a and an overlying MTJ stack layer 150a, which together form an alignment mark structure 180 with the remaining barrier layer 140a, the remaining conductive layer 142a, and the addition alignment mark portion 152a. The alignment mark structure 180 corresponding to the alignment mark region 10M includes the remaining barrier layer 140a and the overlying remaining conductive layer 142a in the trench opening 138 (see FIG. 2G), the conductive pattern layer 148a and the overlying MTJ stack layer 150a conformally covering the remaining conductive layer 142a in the trench opening 138, and the addition alignment mark portion 152a formed over the MTJ stack layer 150a and protruding above the trench opening 138. Therefore, the alignment mark structure 180 extends through the insulating layer 130, the etch stop layers 120 and 118, and the insulating layer 116 and stops on the adhesive layer 114. In some embodiments, the conductive via 143 has a height D1 and a portion of the alignment mark structure 180 that formed in the trench opening 138 has a height D2, as shown in FIG. 2K. The ratio of the height D2 to the height D1 (D2/D1) is in a range from about 3.0 to about 1 (e.g., about 2.77).

Figure 3A:
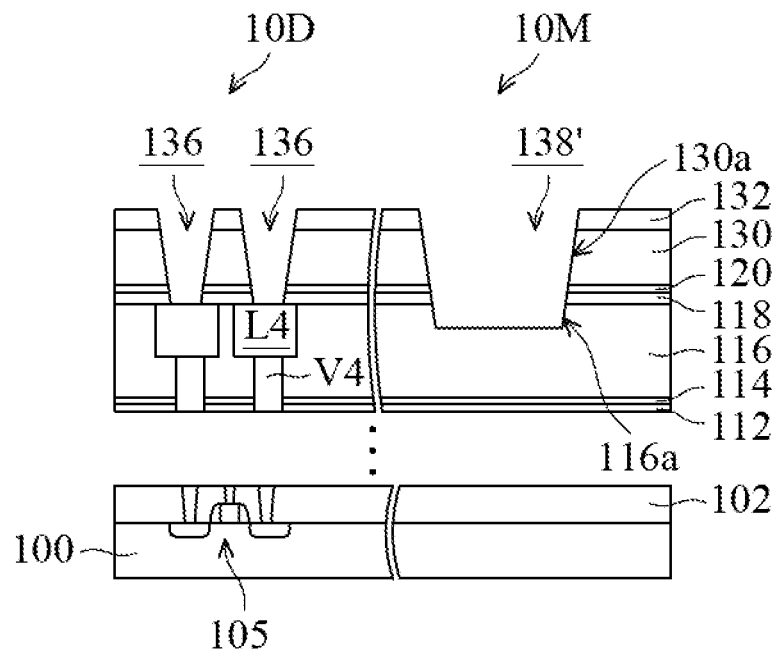

Many variations and/or modifications can be made to embodiments of the disclosure. For example, the semiconductor structure shown in FIG. 2K includes an alignment mark structure extending through the insulating layer 116, but embodiments of the disclosure are not limited thereto. FIGS. 3A to 3L illustrate cross-sectional views of intermediate stages of in the manufacturing of an alignment mark structure for an MRAM cell structure, in accordance with some embodiments. Similarly, in which FIG. 3A illustrates a subsequent processing stage for the structure shown in FIG. 1. The materials and formation methods of the semiconductor shown in FIGS. 2A to 2K may also be applied in the embodiments illustrated in FIGS. 3A to 3L, and may be therefore not repeated.

Additional operations can be provided before, during, and/or after the stages described in FIGS. 3A to 3L. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

A structure similar to the structure shown in FIG. 2B is provided, as shown in FIG. 3A in accordance with some embodiments. Unlike the opening 138 in the structure shown in FIG. 2B, the bottom surface of the opening 138' is within the insulating layer 116, so that the bottom surface of the opening 138' is above the bottom surface of the insulating layer 116 and below the top surface of the insulating layer 116. Moreover, the trench opening 138' includes a lower portion with tapered sidewalls 116a and a top width, and an upper portion with tapered sidewalls 130a and a top width. The top width of the upper portion is greater than the top width of the lower portion, in which the tapered sidewalls 130a are aligned to the tapered sidewalls 116a and extend along the same direction as that of the tapered sidewalls 116a, as shown in FIG. 3A.

Figure 3B:
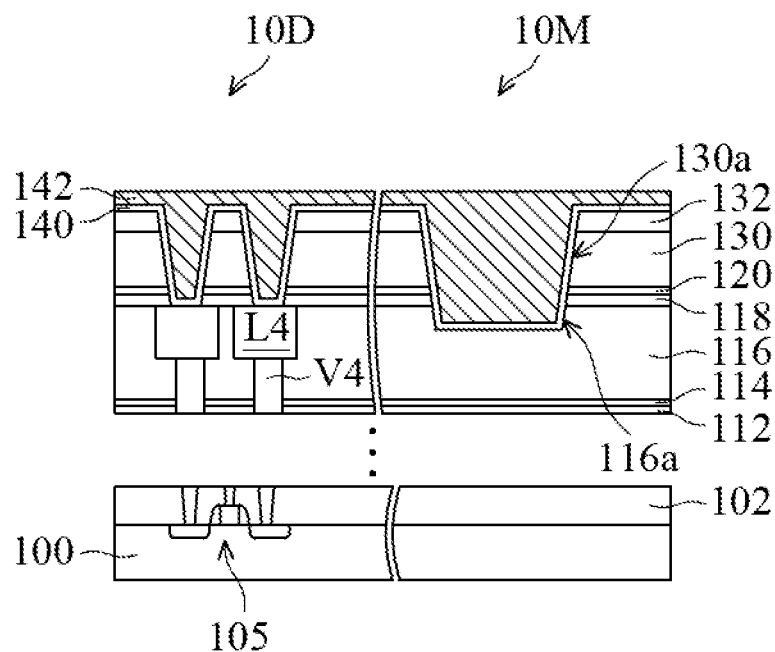
Figure 3C:
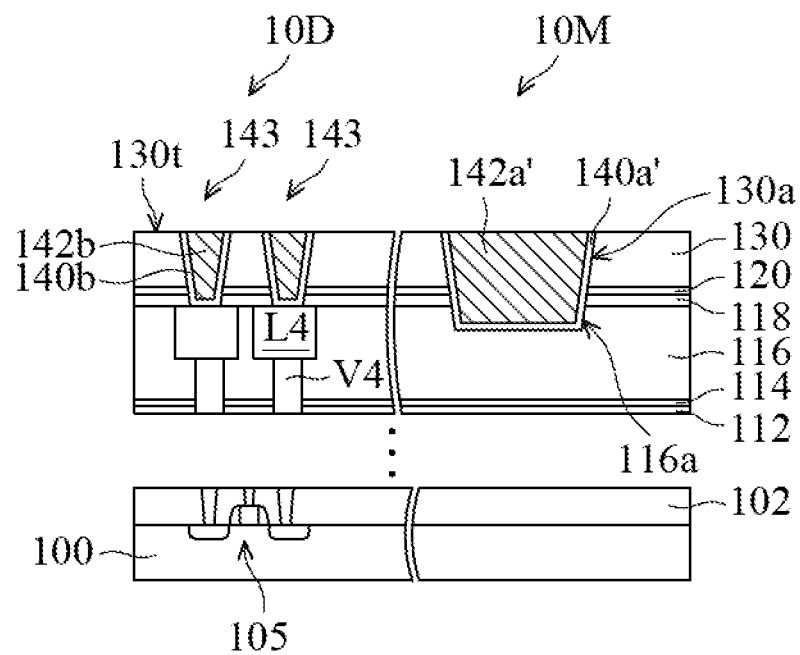

After the via openings 136 and the trench opening 138 are formed, conductive features 143 are formed, as shown in FIGS. 3B to 3C in accordance with some embodiments. Similar to the embodiments shown in FIGS. 2C to 2D, a conductive layer 142 is formed over the insulating layer 132 corresponding to the device region 10D and the alignment mark region 10M and fills the via openings 136 and the trench opening 138' (see FIG. 3A). However, unlike the embodiments shown in FIG. 2C, the via openings 136 and the trench opening 138' are fully filled with the conductive layer 142, as shown in FIG. 3B.

In some embodiments, prior to the formation of the conductive layer 142, a barrier layer 140 is formed conformally over the insulating layer 132 corresponding to the device region 10D and the alignment mark region 10M and fills the via openings 136 and the trench opening 138.

After the formation of the conductive layer 142, a planarization process, such as a CMP or a mechanical grinding process, is performed to remove the excess portions of the conductive layer 142 and the barrier layer 140 (excess portions of which are over the top surface of the insulating layer 130), and the insulating layer 132. The remaining barrier layer 140b and the remaining conductive layer 142b in each via opening 136 thus form the conductive feature (or conductive via) 143 that is electrically connected to the metal line L4. Moreover, the remaining barrier layer 140a' and the remaining conductive layer 142a' in the trench opening 138' thus form a portion of the subsequently formed alignment mark structure.

Figure 3D:
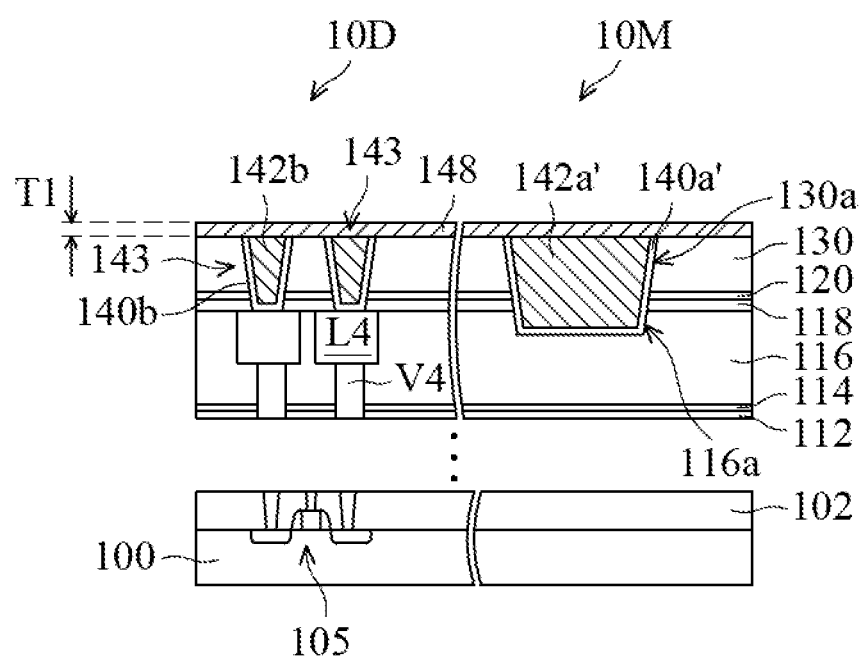
Figure 3E:
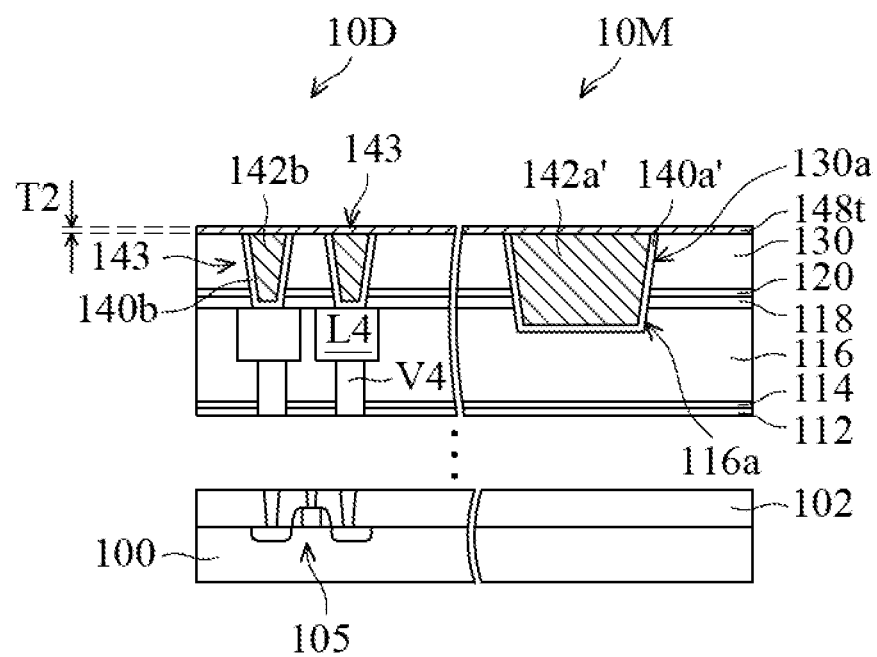

After the conductive vias 143 are formed, a bottom electrode layer is formed conformally over the structure shown in FIG. 3C, as shown in FIGS. 3D to 3E. More specifically, as shown in FIG. 3D, a conductive layer 148 is formed to cover the insulating layer 130 corresponding to the device region 10D and the alignment mark region 10M, the conductive vias 143, and the remaining barrier layer 140a' and the remaining conductive layer 142a' in the trench opening 138'. A portion of the conductive layer 148 corresponding to the device region 10D serves as a bottom electrode layer for a subsequently formed MRAM cell structure. A portion of the conductive layer 148 corresponding to the alignment mark region 10M and covering the trench opening 138' forms a portion of the subsequently formed alignment mark structure. In some embodiments, the conductive layer 148 corresponding to the trench opening 138' has a bottom surface that is substantially level with a top surface of the insulating layer 130. The conductive layer 148 may be formed to a thickness T1 in a range from about 100 Å to about 200 Å (e.g., about 160 Å).

Afterwards, the conductive layer 148 shown in FIG. 3D is thinned, as shown in FIG. 3E. In some embodiments, a thinned conductive layer 148t having a thickness of T2. For example, the thickness T2 may be in a range from about 50 Å to about 100 Å (e.g., about 80 Å).

Figure 3F:
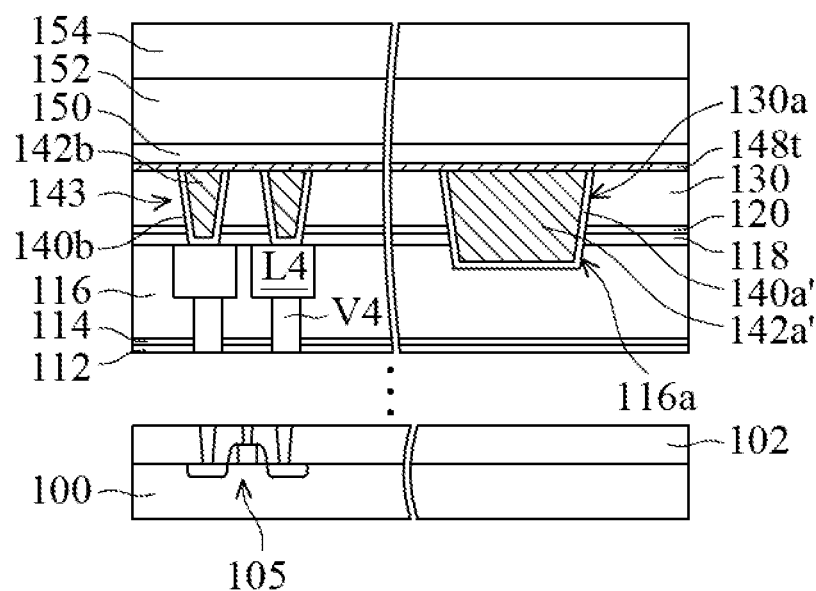

Similar to the embodiments shown in FIG. 2G, after the formation of the thinned conductive layer 148t, a MTJ stack layer 150, a conductive layer 150, and a masking layer 154 are successively formed over the thinned conductive layer 148t to cover the device region 10D and the alignment mark region 10M, as shown in FIG. 3F in accordance with some embodiments. Since the thinned conductive layer 148t is not patterned prior to the formation of the MTJ stack layer 150, the formed MTJ stack layer 150 can extend over both of the alignment mark region 10M and the device region 10D to cover the entire surface of the thinned conductive layer 148t, thereby increasing the reliability of the formed MTJ stack layer 150.

A portion of the conductive layer 152 corresponding to the device region 10D serves as a top electrode layer for a subsequently formed MRAM cell structure. A portion of the conductive layer 152 corresponding to the alignment mark region 10M forms a portion of the subsequently formed alignment mark structure. In some embodiments, the masking layer 154 and the underlying conductive layer 152 are used as a hard mask in the subsequent patterning of the MTJ stack layer 150.

Figure 3G:
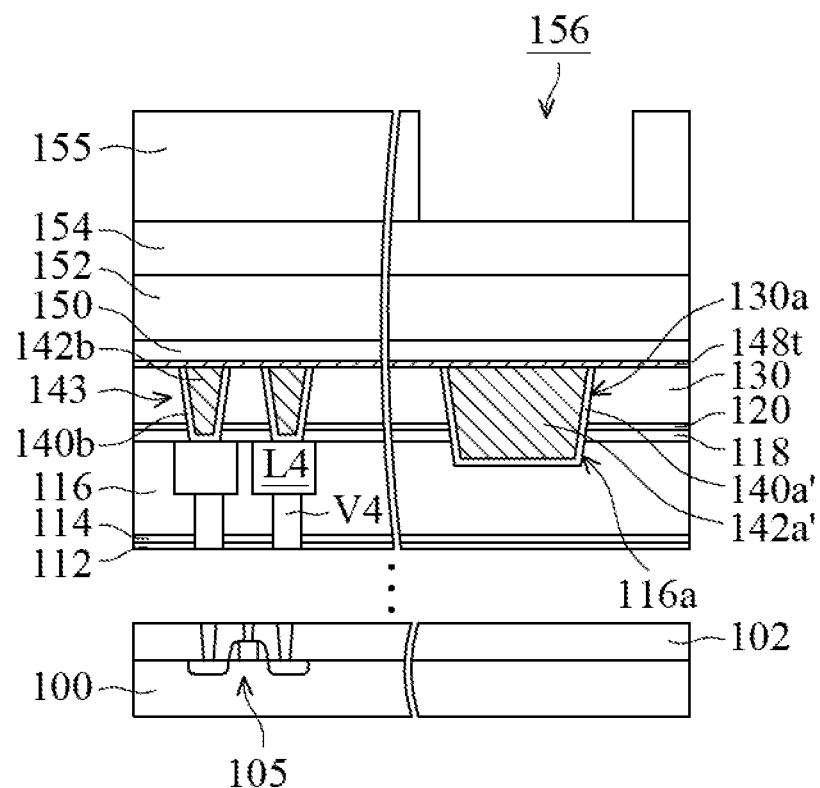
Figure 3H:
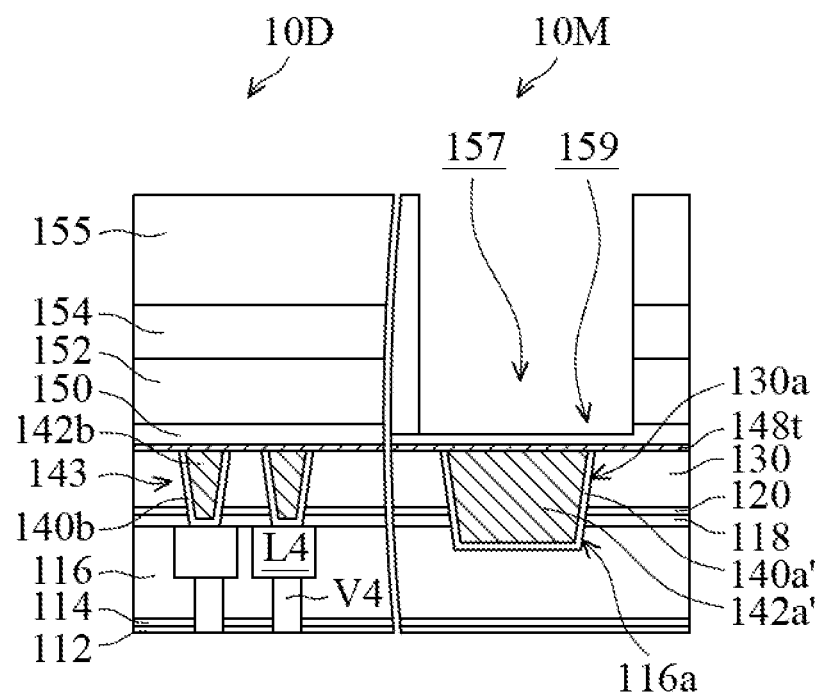

Afterwards, the masking layer 154, the conductive layer 152 and the MTJ stack layer 150 are successively etched, as shown in FIGS. 3G to 3H in accordance with some embodiments. More specifically, a lithography process is performed to form a patterned photoresist layer 155 with an opening pattern 156 corresponding to the alignment mark region 10M and directly above the trench opening 138' (see FIG. 3A), as shown in FIG. 3G.

After the photoresist layer 155 is formed, the opening pattern 156 is transferred into the masking layer 154 and the conductive layer 152 thereunder by an etching process to form a trench opening 157 passing through the masking layer 154. As a result, a portion of the MTJ stack layer 150 is exposed, as shown in FIG. 3H. Moreover, the formed trench opening 157 has a width greater than a top width of the trench opening 138'. The etching process may include dry etching, wet etching, reactive ion etching (RIE), and/or other suitable processes. Afterwards, the exposed portion of the MTJ stack layer 150 is etched to form a recess 159 directly below the trench opening 157. As a result, the MTJ stack layer 150 corresponding to the alignment mark region 10M and below the recess 159 is thinner than the MTJ stack layer corresponding to the device region 10D. The recessed portion of the MTJ stack layer 150 can increase the transmittance of the MTJ stack layer 150 corresponding to the alignment mark region 10M, thereby improving alignment performance of the subsequently formed alignment mark structure. For example, the MTJ stack layer 150 prior to the formation of the recess 159 has a thickness that is in a range from about 150 Å to about 250 Å (e.g., about 190 Å). The MTJ stack layer 150 is recessed to a depth that is in a range from about 10 Å to about 50 Å (e.g., about 30 Å).

Figure 3I:
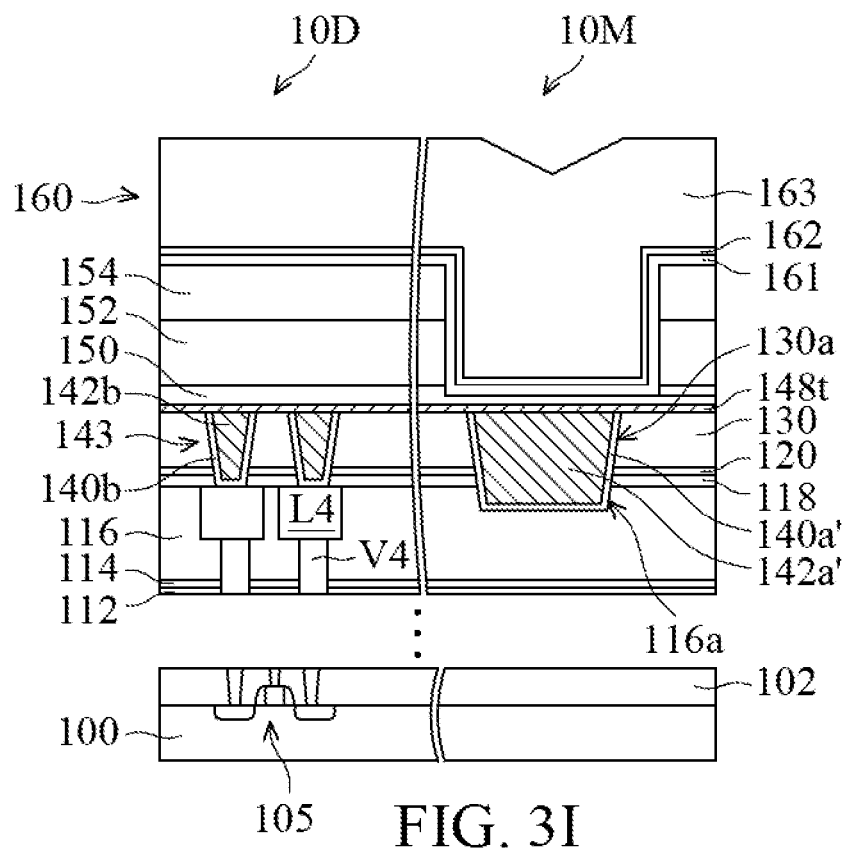
Figure 3J:
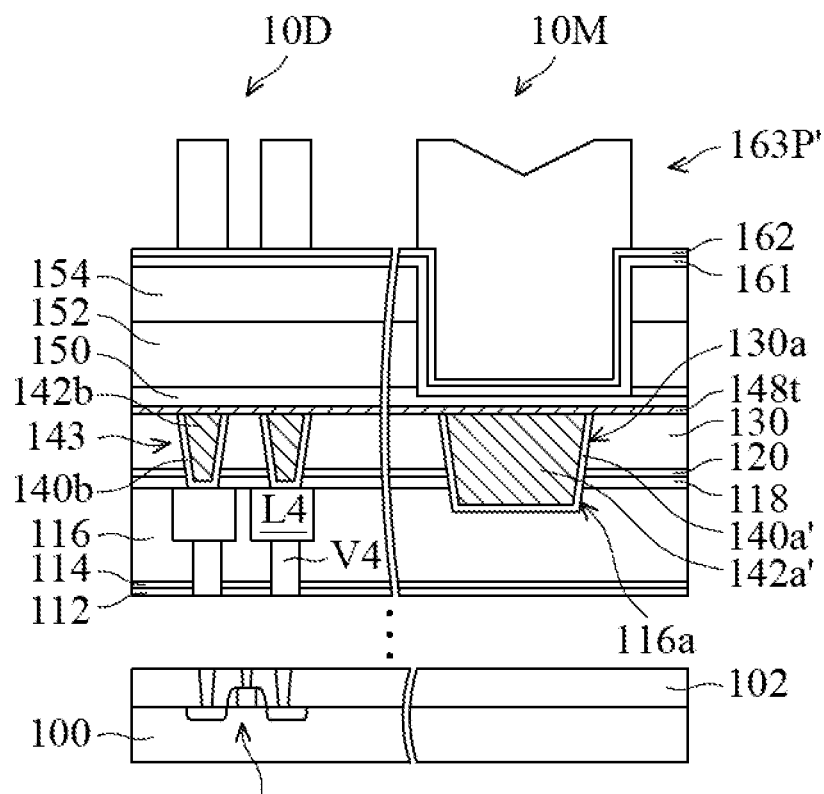

Similar to the embodiments shown in FIGS. 2H to 2I, a tri-layer mask structure 160 is formed over the hard mask including the masking layer 152 and the conductive layer 152 and patterned, as shown in FIGS. 3I to 3J in accordance with some embodiments. The tri-layer mask structure 160 includes a BARC layer 161, an intermediate layer 162 over the BARC layer 161, and a top photoresist layer 163 over the intermediate layer 162. As shown in FIG. 3I, the BARC layer 161 and the intermediate layer 162 are formed conformally over the masking layer 154 and in the recess 159 and the trench opening 157 (see FIG. 3H). The top photoresist layer 163 is formed above the masking layer 154 and fully fills the trench opening 157.

After the tri-layer mask structure 160 is formed, a lithography process is performed using the alignment mark structure (which at least includes the recessed portion of the MTJ stack layer 150, the conductive layer 148t, and the remaining conductive layer 142a', and the remaining barrier layer 140a') in the alignment mark region 10M. As a result, a patterned top photoresist layer 163P' with the MRAM cell patterns corresponding to the device region 10D and the alignment mark pattern corresponding to the alignment mark region 10M is formed to expose portions of the intermediate layer 162, as shown in FIG. 3J.

Figure 3K:
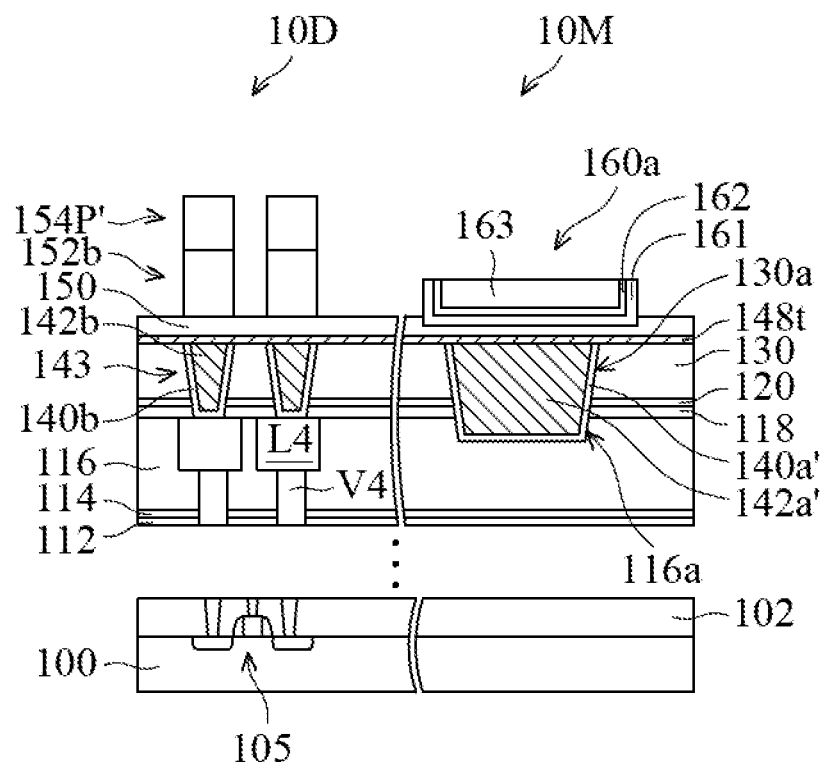

After the patterned top photoresist layer 163P' is formed, these patterns are transferred into the masking layer 154 and the conductive layer 152 thereunder by an etching process, as shown in FIG. 3K in accordance with some embodiments. Portions of the patterned top photoresist layer 163P', the intermediate layer 162 and the BARC layer 161 that correspond to the device region 10D may be consumed in the etching process, and portions of the patterned top photoresist layer 163P', the intermediate layer 162 and the BARC layer 161 that are formed in the recess 159 and the trench opening 157 (see FIG. 3H) may be remained to together form a tri-layer mask structure 160a for the subsequently etching process. During the etching process, the patterned masking layer 154P' is used as an etch mask to pattern the conductive layer 152 thereunder. As a result, the patterned conductive layer 152 with the MRAM cell patterns corresponding to the device region 10D is formed to expose portions of the MTJ stack layer 150, as shown in FIG. 3K. In some embodiments, the patterned conductive layer 152 corresponding to the device region 10D forms top electrode layers 152b for the subsequently formed MRAM cell structures.

Figure 3L:
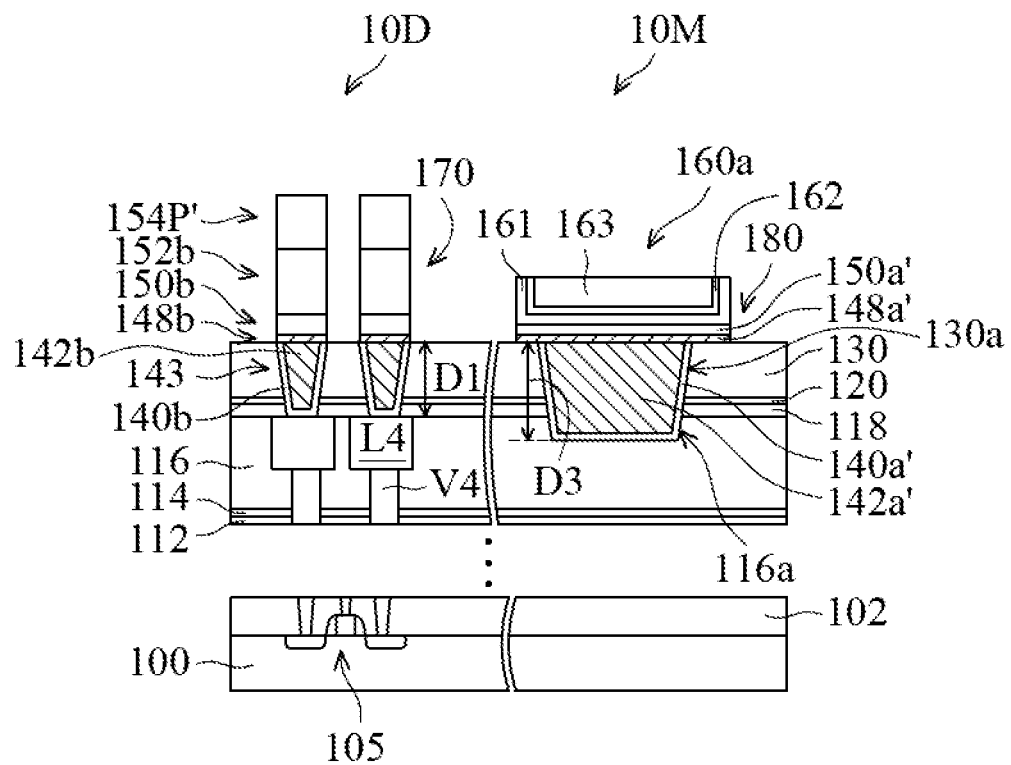

Afterwards, the patterned masking layer 154P' and the top electrode layers 152b in the device region 10D and the tri-layer mask structure 160a are used an etch mask to etch the exposed portions of the MTJ stack layer 150 and the thinned conductive layer 148t thereunder, as shown in FIG. 3L in accordance with some embodiments. The etching process forms bottom electrode layers 148b and MTJ stack layers 150b, which together form MRAM cell structures 170 with the top electrode layers 152b. Each MRAM cell structure 170 corresponding to the device region 10D includes one bottom electrode layer 148b electrically connected to a corresponding conductive via 143, one MTJ stack layer 150b formed over the bottom electrode layer 148b, and one top electrode layer 152b formed over the MTJ stack layer 150b. In some embodiments, additional spacers (not shown) are also formed around the memory cell structures (e.g., MRAM cell structures 170) to surround and protect the components of the memory cell structures.

The etching process also forms a conductive pattern layer 148a' and an overlying recessed MTJ stack layer 150a', which together form an alignment mark structure 180 with the remaining barrier layer 140a', and the remaining conductive layer 142a'. The alignment mark structure 180 corresponding to the alignment mark region 10M includes the remaining barrier layer 140a' and the overlying remaining conductive layer 142a' in the trench opening 138' (see FIG. 3A), the conductive pattern layer 148a' and the overlying MTJ stack layer 150a covering the remaining conductive layer 142a' and the remaining barrier layer 140a' in the trench opening 138'. Therefore, the alignment mark structure 180 extends through the insulating layer 130 and the etch stop layers 120 and 118, and into the insulating layer 116, so as to form a bottom surface above the bottom surface of the insulating layer 116. In some embodiments, the conductive via 143 has a height D1 and a portion of the alignment mark structure 180 that formed in the trench opening 138' has a height D3, as shown in FIG. 3L. The ratio of the height D3 to the height D1 (D3/D1) is in a range from about 2.0 to about 1 (e.g., about 1.63).

Embodiments of the disclosure provide semiconductor structures and formation methods thereof. The formation of the semiconductor structure includes successively forming a first insulating layer and a second insulating layer to cover a device region and an alignment mark region of a semiconductor substrate. Afterwards, a first opening is formed in the second insulating layer corresponding to the device region and a second opening is formed in the first and second openings. Afterwards, an alignment mark structure including a first conductive layer, a second conductive layer and a magnetic tunnel junction (MTJ) stack layer is formed in the second opening. During the formation of the alignment mark structure, the second opening is partially filled with the first conductive layer, and the formed second opening passes through the first insulating layer, so that less lithography processes are used for definition of the alignment mark. As a result, process steps for fabrication of the semiconductor device are simplified, while maintaining the lithography alignment performance. Therefore, the manufacturing cost can be reduced. In addition, in the case of the formed second opening without passing through the first insulating layer, the second opening may be fully filled with the first conductive layer, so that the formed second conductive layer and the overlying MTJ stack layer form a flat layer. As a result, peeling off between the MTJ stack layer and the underlying and/or overlying layer corresponding to the alignment mark region can be eliminated or mitigated. Therefore, the reliability of the MTJ stack layer is improved. In this case, the MTJ stack layer is thinned further during the formation of the alignment mark structure. As a result, the transmittance of the MTJ stack layer can be increased, thereby improving alignment performance of the alignment mark structure.

In accordance with some embodiments, a semiconductor structure is provided. The semiconductor structure includes a first insulating layer covering a device region and an alignment mark region of a semiconductor substrate. The semiconductor structure also includes a first conductive feature formed in the first insulating layer and corresponding to the device region. In addition, the semiconductor structure includes an alignment mark structure formed in the first insulating layer and corresponding to the alignment mark region. The alignment mark structure includes a first conductive layer, a second conductive layer covering the first conductive layer, and a first magnetic tunnel junction (MTJ) stack layer covering the second conductive layer. The first conductive layer and the first conductive feature are made of the same material.

In accordance with some embodiments, a method of forming a semiconductor structure is provided. The method includes successively forming a first insulating layer and a second insulating layer to cover a device region and an alignment mark region of a semiconductor substrate. The method also includes forming a first opening in the second insulating layer corresponding to the device region and a second opening in the second insulating layer and the first insulating layer and corresponding to the alignment mark region. The method further includes forming a first conductive layer in the first opening and the second opening. In addition, the method includes successively forming a second conductive layer and a magnetic tunnel junction (MTJ) stack layer over the second insulating layer corresponding to the device region and the alignment mark region to cover the first conductive layer in the first opening and the second opening. The method also includes patterning the MTJ stack layer corresponding to the device region. The MTJ stack layer, the second conductive layer, and the first conductive layer corresponding to the second opening are used as an alignment mark to pattern the MTJ stack layer corresponding to the device region.

In accordance with some embodiments, a method for forming a semiconductor structure is provided. The method includes forming an insulating layer to cover a device region and an alignment mark region of a semiconductor substrate. The method also includes forming a first opening and a second opening in the insulating layer and corresponding to the device region and the alignment mark region, respectively. The method further includes forming a first conductive layer in the first opening and the second opening and covering the insulating layer corresponding to the device region and the alignment mark region and the first conductive layer corresponding to the first opening and the second opening with a second conductive layer. In addition, the method includes thinning the second conductive layer and forming a magnetic tunnel junction (MTJ) stack layer over the thinned second conductive layer corresponding to the first opening and the second opening. The method also includes patterning the MTJ stack layer. The MTJ stack layer, the second conductive layer, and the first conductive layer corresponding to the second opening are used as an alignment mark to pattern the MTJ stack layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   successively forming a first insulating layer and a second insulating layer to cover a device region and an alignment mark region of a semiconductor substrate;
   forming a first opening in the second insulating layer corresponding to the device region and a second opening in the second insulating layer and the first insulating layer and corresponding to the alignment mark region;
   forming a first conductive layer in the first opening and the second opening;
   successively forming a second conductive layer and a magnetic tunnel junction (MTJ) stack layer over the second insulating layer corresponding to the device region and the alignment mark region to cover the first conductive layer in the first opening and the second opening, wherein a bottom surface of the second conductive layer and a bottom surface of the MTJ layer that correspond to a bottom surface of the second opening are within the first insulating layer; and
   patterning the MTJ stack layer corresponding to the device region, wherein the MTJ stack layer, the second conductive layer, and the first conductive layer corresponding to the second opening are used as an alignment mark to pattern the MTJ stack layer corresponding to the device region.

2. The method as claimed in claim 1, further comprising:
   successively forming a third conductive layer and a masking layer over the MTJ stack layer corresponding to the device region and the alignment mark region before the MTJ stack layer is patterned; and
   successively patterning the masking layer and the third conductive layer corresponding to the device region, wherein the MTJ stack layer is patterned using the patterned masking layer as an etch mask.

3. The method as claimed in claim 2, further comprising:
   forming a tri-layer mask structure over the masking layer, wherein the tri-layer mask structure comprises:
   a bottom anti-reflective coating (BARC) layer;
   an intermediate layer over the BARC layer; and
   a top photoresist layer over the intermediate layer; and
   patterning the tri-layer mask structure, wherein the masking layer is patterned using the patterned tri-layer mask structure as an etch mask.

4. The method as claimed in claim 2, wherein a portion of the third conductive layer and a portion of the MTJ stack layer extend into the second opening, and wherein the portion of the third conductive layer has sidewall surfaces and a bottom surface surrounded by the portion of the MTJ stack layer.

5. The semiconductor structure as claimed in claim 1, wherein a portion of the second conductive layer and a portion of the MTJ stack layer extend into the second opening, and wherein the portion of the MTJ stack layer has sidewall surfaces and a bottom surface surrounded by the portion of the second conductive layer.

6. The semiconductor structure as claimed in claim 5, wherein the portion of the second conductive layer has sidewall surfaces and a bottom surface surrounded by the first conductive layer formed in the second opening.

7. A method of forming a semiconductor structure, comprising:
   forming an insulating layer to cover a device region and an alignment mark region of a semiconductor substrate;
   forming a first opening and a second opening in the insulating layer and corresponding to the device region and the alignment mark region, respectively;
   forming a first conductive layer in the first opening and the second opening;
   covering the insulating layer corresponding to the device region and the alignment mark region and the first conductive layer corresponding to the first opening and the second opening with a second conductive layer, wherein a level of a top surface of the second conductive layer corresponding to a bottom of the second opening is lower than a level of a bottom surface of the first conductive layer corresponding to the first opening;
   thinning the second conductive layer;
   forming a magnetic tunnel junction (MTJ) stack layer over the thinned second conductive layer corresponding to the first opening and the second opening; and
   patterning the MTJ stack layer, wherein the MTJ stack layer, the second conductive layer, and the first conductive layer corresponding to the second opening are used as an alignment mark to pattern the MTJ stack layer.

8. The method as claimed in claim 7, further comprising:
   successively forming a third conductive layer and a masking layer over the MTJ stack layer corresponding to the device region and the alignment mark region before the MTJ stack layer is patterned;
   forming a third opening in the masking layer and the third conductive layer to expose the MTJ stack layer corresponding to the alignment mark region;
   recessing the exposed MTJ stack layer in the third opening; and
   successively patterning the masking layer and the third conductive layer corresponding to the device region, wherein the MTJ stack layer is patterned using the patterned masking layer as an etch mask.

9. The method as claimed in claim 8, further comprising:
   forming a tri-layer mask structure over the masking layer and in the third opening, wherein the tri-layer mask structure comprises:
   a bottom anti-reflective coating (BARC) layer;
   an intermediate layer over the BARC layer; and
   a top photoresist layer over the intermediate layer; and
   patterning the tri-layer mask structure, wherein the masking layer is patterned using the patterned tri-layer mask structure as an etch mask.

10. The method as claimed in claim 8, wherein the third opening has a width greater than a width of the second opening.

11. The method as claimed in claim 7, wherein the second conductive layer corresponding to the second opening has a bottom surface substantially level with a top surface of the insulating layer.

12. The method as claimed in claim 7, wherein the second opening extends through the insulating layer and has tapered sidewalls.

13. A method of forming a semiconductor structure, comprising:

successively forming a first insulating layer and a second insulating layer to cover a device region and an alignment mark region of a semiconductor substrate;

forming a first conductive layer in the second insulating layer corresponding to the device region and lining sidewalls and a bottom of a trench opening in the first and second insulating layers corresponding to the alignment mark region, wherein the trench opening has a bottom surface that is level to a bottom surface of the first insulating layer;

forming a magnetic tunnel junction (MTJ) stack layer over the first conductive layer corresponding to the device region and conformally covering the first conductive layer in the trench opening; and patterning the MTJ stack layer corresponding to the device region, wherein the MTJ stack layer and the first conductive layer corresponding to the alignment mark region are used as an alignment mark to pattern the MTJ stack layer corresponding to the device region.

14. The method as claimed in claim 13, further comprising:

forming a second conductive layer over the first conductive layer corresponding to the device region and conformally covering the first conductive layer in the trench opening before forming the MTJ stack layer; and forming a masking layer over the MTJ stack layer and extending into the trench opening; and patterning the masking layer.

15. The method as claimed in claim 14, further comprising:

forming a tri-layer mask structure over the masking layer, wherein the tri-layer mask structure comprises:

a bottom anti-reflective coating (BARC) layer;

an intermediate layer over the BARC layer; and a top photoresist layer over the intermediate layer; and patterning the tri-layer mask structure, wherein the masking layer is patterned using the patterned tri-layer mask structure as an etch mask, and wherein the MTJ stack layer is patterned using the patterned masking layer as an etch mask.

16. The method as claimed in claim 14, wherein the alignment mark further comprising the second conductive layer in the trench opening.

17. The method as claimed in claim 1, wherein a top surface of the first insulating layer is separated from a bottom surface of the second insulating layer.

18. The method as claimed in claim 1, wherein a level of a top surface of the second conductive layer corresponding to a bottom of the second opening is lower than a level of a bottom surface of the first conductive layer corresponding to the first opening.

19. The method as claimed in claim 13, wherein the trench opening has lower sidewalls with a first tapered profile and upper sidewalls with a second tapered profile, and wherein a slope of the first tapered profile is different than a slope of the second tapered profile.

20. The method as claimed in claim 13, wherein a level of a top surface of the second conductive layer corresponding to a bottom of the second opening is lower than a level of a bottom surface of the first conductive layer corresponding to the first opening.

* * * * *